(12) United States Patent
Nagashima et al.

(10) Patent No.: US 8,575,589 B2
(45) Date of Patent: Nov. 5, 2013

(54) NONVOLATILE SEMICONDUCTOR MEMORY DEVICE AND METHOD OF MANUFACTURING THE SAME

(75) Inventors: Hiroyuki Nagashima, Yokohama (JP); Koichi Kubo, Yokohama (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 12/271,434

(22) Filed: Nov. 14, 2008

(65) Prior Publication Data

US 2009/0121208 A1 May 14, 2009

(30) Foreign Application Priority Data

Nov. 14, 2007 (JP) ................................. 2007-295962

(51) Int. Cl.
*H01L 29/06* (2006.01)
(52) U.S. Cl.
USPC ..................... 257/5; 257/E27.104
(58) Field of Classification Search
USPC .......... 257/4, 5, 379, 910, E45.002, E27.104, 257/E29.33
See application file for complete search history.

(56) References Cited

U.S. PATENT DOCUMENTS

| | | | |
|---|---|---|---|
| 6,972,985 B2 | 12/2005 | Rinerson et al. | |
| 7,009,278 B2 | 3/2006 | Hsu | |
| 7,417,245 B2* | 8/2008 | Happ et al. .................... | 257/2 |
| 2003/0194865 A1* | 10/2003 | Gilton ............................ | 438/689 |
| 2004/0171208 A1* | 9/2004 | Gilton ............................ | 438/239 |
| 2004/0228172 A1 | 11/2004 | Rinerson et al. | |
| 2006/0245243 A1* | 11/2006 | Rinerson et al. .............. | 365/171 |
| 2006/0268594 A1* | 11/2006 | Toda .............................. | 365/100 |
| 2007/0096162 A1* | 5/2007 | Happ et al. .................... | 257/246 |
| 2007/0159868 A1* | 7/2007 | Sugita et al. .................. | 365/100 |
| 2008/0090400 A1* | 4/2008 | Cheek et al. .................. | 438/597 |
| 2008/0219039 A1* | 9/2008 | Kumar et al. ................. | 365/148 |
| 2009/0102598 A1 | 4/2009 | Yamazaki et al. | |
| 2009/0309088 A1 | 12/2009 | Sakamoto | |

FOREIGN PATENT DOCUMENTS

| | | |
|---|---|---|
| EP | 1 848 048 A2 | 10/2007 |
| JP | 2007-27537 A | 2/2007 |
| JP | 2007-134603 | 5/2007 |
| JP | 2007-536680 A | 12/2007 |
| JP | 2008-53709 A | 3/2008 |
| KR | 2004-54250 | 6/2004 |
| TW | 1239072 | 9/2005 |
| WO | WO 2005/117021 A1 | 12/2005 |
| WO | WO 2008/001712 A1 | 1/2008 |
| WO | WO 2008/155832 A1 | 12/2008 |

OTHER PUBLICATIONS

Korean Office Action (w/English translation) Issued on Sep. 29, 2010 for Application No. 10-2008-112599.

(Continued)

*Primary Examiner* — Vongsavanh Sengdara
(74) *Attorney, Agent, or Firm* — Oblon, Spivak. McClelland, Maier & Neustadt, L.L.P.

(57) ABSTRACT

A nonvolatile semiconductor memory device includes a plurality of first lines; a plurality of second lines crossing the plurality of first lines; a plurality of memory cells each connected at an intersection of the first and second lines between both lines and including a variable resistor operative to store information in accordance with a variation in resistance; and a protection film covering the side of the variable resistor to suppress migration of cations at the side of the variable resistor.

8 Claims, 20 Drawing Sheets

(56) References Cited

OTHER PUBLICATIONS

Korean Office Action issued on Apr. 7, 2011 in corresponding Korean Application No. 10-2011-16914 (with an English Translation).

Japanese Office Action Issued Sep. 25, 2012 in patent Application No. 2007-295962 (with English translation).

Japanese Office Action issued Jun. 26, 2012 in Patent Application No. 2007-295962 with English Translation.

Combined Taiwanese Office Action and Search Report issued May 13, 2013 in Patent Application No. 097140479 with English Translation.

* cited by examiner

FIG. 6
(a) Schottky Structure
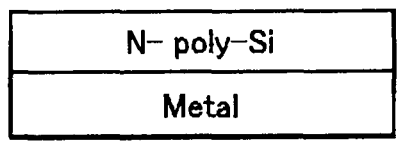
(b) PN Structure
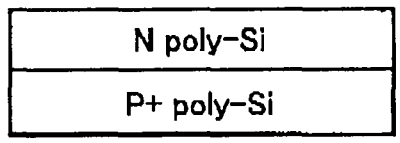
(c) PIN Structure
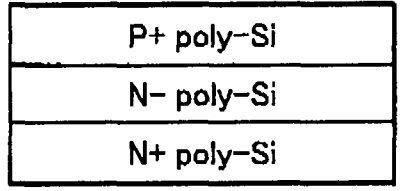
(d) MIM Structure
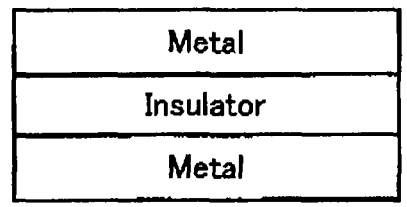
(e) SIS Structure
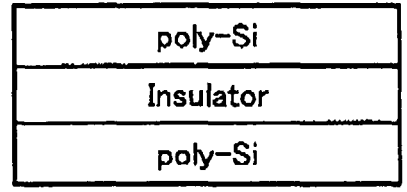

NONVOLATILE SEMICONDUCTOR MEMORY DEVICE AND METHOD OF MANUFACTURING THE SAME

CROSS-REFERENCE TO RELATED APPLICATION

This application is based upon and claims the benefit of priority from the prior Japanese Patent Application No. 2007-295962, filed on Nov. 14, 2007, the entire contents of which are incorporated herein by reference.

BACKGROUND OF THE INVENTION

1. Field of the Invention

The present invention relates to a nonvolatile semiconductor memory device and method of manufacturing the same.

2. Description of the Related Art

Electrically erasable programmable nonvolatile memories include a flash memory as well known in the art, which comprises a memory cell array of NAND-connected or NOR-connected memory cells having a floating gate structure. A ferroelectric memory is also known as a nonvolatile fast random access memory.

On the other hand, technologies of pattering memory cells much finer include a resistance variable memory, which uses a variable resistor in a memory cell as proposed. Known examples of the variable resistor include a phase change memory element that varies the resistance in accordance with the variation in crystal/amorphous states of a chalcogenide compound; an MRAM element that uses a variation in resistance due to the tunnel magneto-resistance effect; a polymer ferroelectric RAM (PFRAM) memory element including resistors formed of a conductive polymer; and a ReRAM element that causes a variation in resistance on electrical pulse application (Patent Document 1: JP 2006-344349A, paragraph 0021).

The resistance variable memory may configure a memory cell with a serial circuit of a Schottky diode and a resistance variable element in place of the transistor. Accordingly, it can be stacked easier and three-dimensionally structured to achieve much higher integration advantageously (Patent Document 2: JP 2005-522045A).

SUMMARY OF THE INVENTION

In an aspect the present invention provides a nonvolatile semiconductor memory device, comprising: a plurality of first lines; a plurality of second lines crossing the plurality of first lines; a plurality of memory cells each connected at an intersection of the first and second lines between both lines and including a variable resistor operative to store information in accordance with a variation in resistance; and a protection film covering the side of the variable resistor to suppress migration of cations at the side of the variable resistor.

In another aspect the present invention provides a nonvolatile semiconductor memory device, comprising: a plurality of first lines; a plurality of second lines crossing the plurality of first lines; a plurality of memory cells each connected at an intersection of the first and second lines between both lines and including a variable resistor operative to store information in accordance with a variation in resistance; and a protection film covering the side of the variable resistor to suppress at least one of reduction reaction, oxidation reaction and migration of anions at the side of the variable resistor.

In another aspect the present invention provides a method of manufacturing nonvolatile semiconductor memory devices, comprising: sequentially depositing a first metal layer, a barrier metal layer, a non-ohmic element layer, a first electrode layer, a variable resistor layer, and a second electrode layer in a memory cell array to form a stacked structure; forming a trench to separate the stacked structure; forming a protection film on the side of the trench; burying an insulator film in the trench covered with the protection film and planarizing the insulator film; and forming a second metal layer in the memory cell array over the insulator film, the protection film and the second electrode layer.

BRIEF DESCRIPTION OF THE DRAWINGS

FIG. 6 is a schematic cross-sectional view showing a non-ohmic element example in the same embodiment.

DETAILED DESCRIPTION OF THE EMBODIMENTS

The embodiments of the invention will now be described with reference to the drawings.

First Embodiment

Entire Configuration

Figure 1:
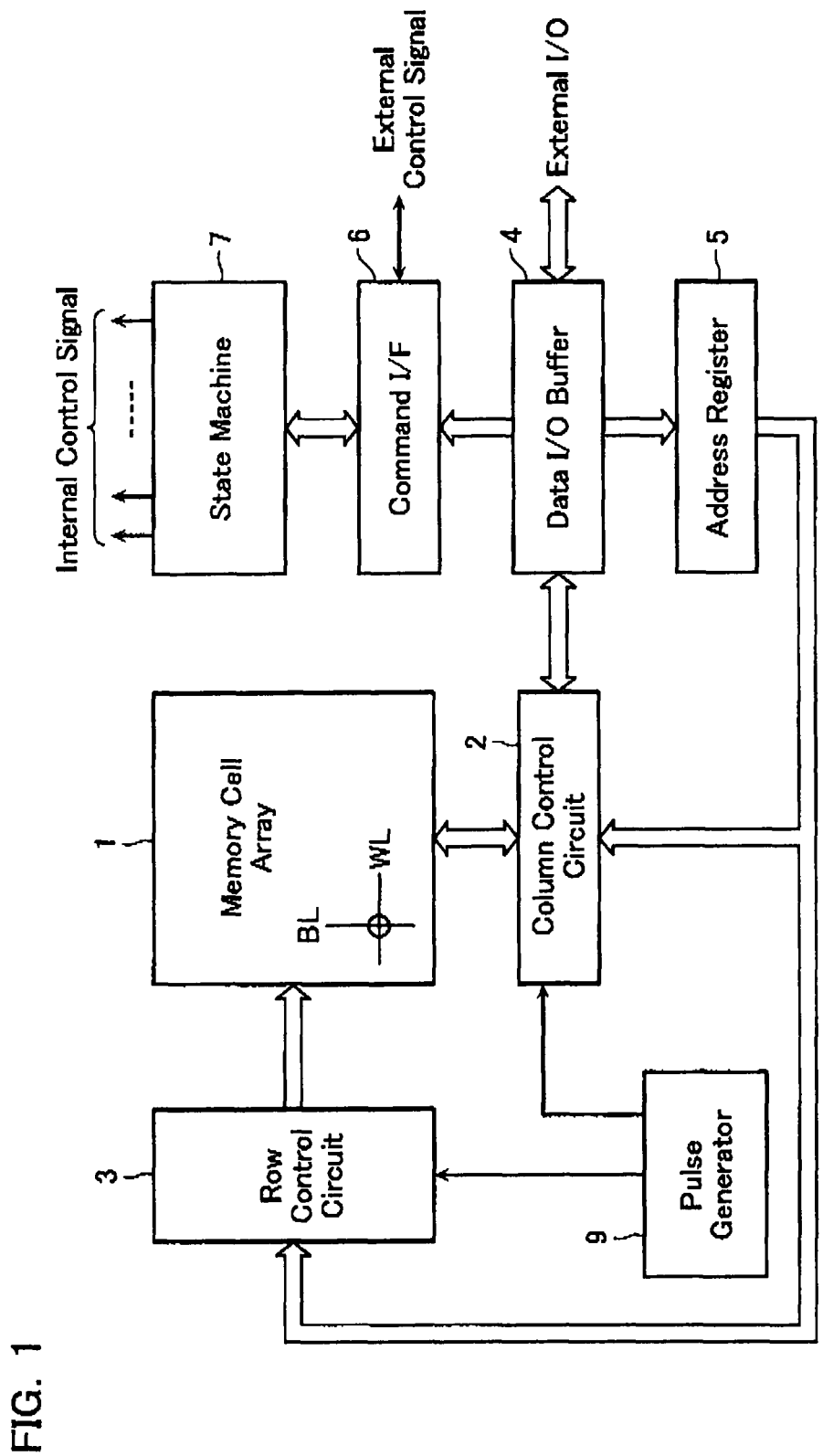
FIG. 1 is a block diagram of a nonvolatile memory according to a first embodiment of the present invention.

FIG. 1 is a block diagram of a nonvolatile memory according to a first embodiment of the present invention.

The nonvolatile memory comprises a memory cell array 1 of memory cells arranged in matrix, each memory cell including a later-described ReRAM (variable resistor). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface 6 transfers it as a received command signal to a state machine 7. The state machine 7 manages the entire nonvolatile memory to receive commands from the host to execute read, write, erase, and execute data I/O management. The external host can also receive status information managed by the state machine 7 and decides the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3.

Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

[Memory Cell Array and Peripheral Circuits]

Figure 2:
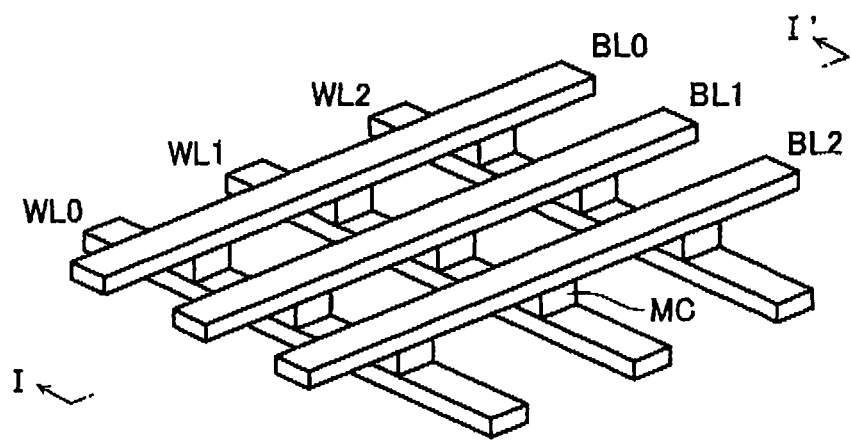
FIG. 2 is a perspective view of part of a memory cell array in the nonvolatile memory according to the same embodiment.
Figure 3:
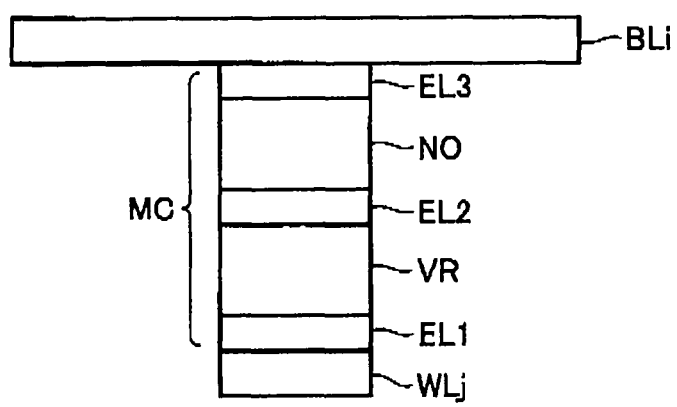
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines orbit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VR can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

The variable resistor VR may include one that comprises a composite compound containing cations of a transition element and varies the resistance through migration of cations (ReRAM).

Figure 4:
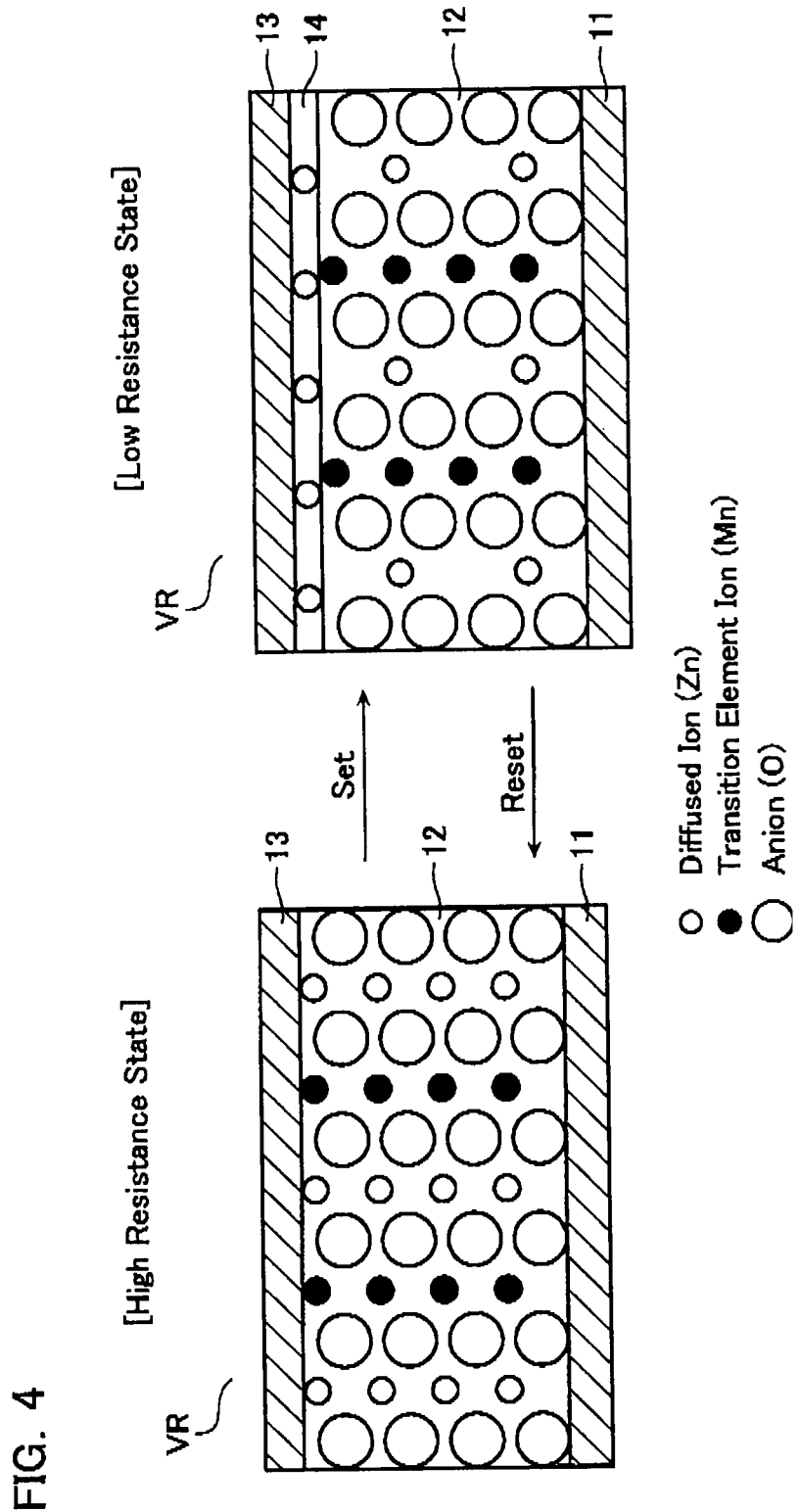
FIG. 4 is a schematic cross-sectional view showing a variable resistor example in the same embodiment.
Figure 5:
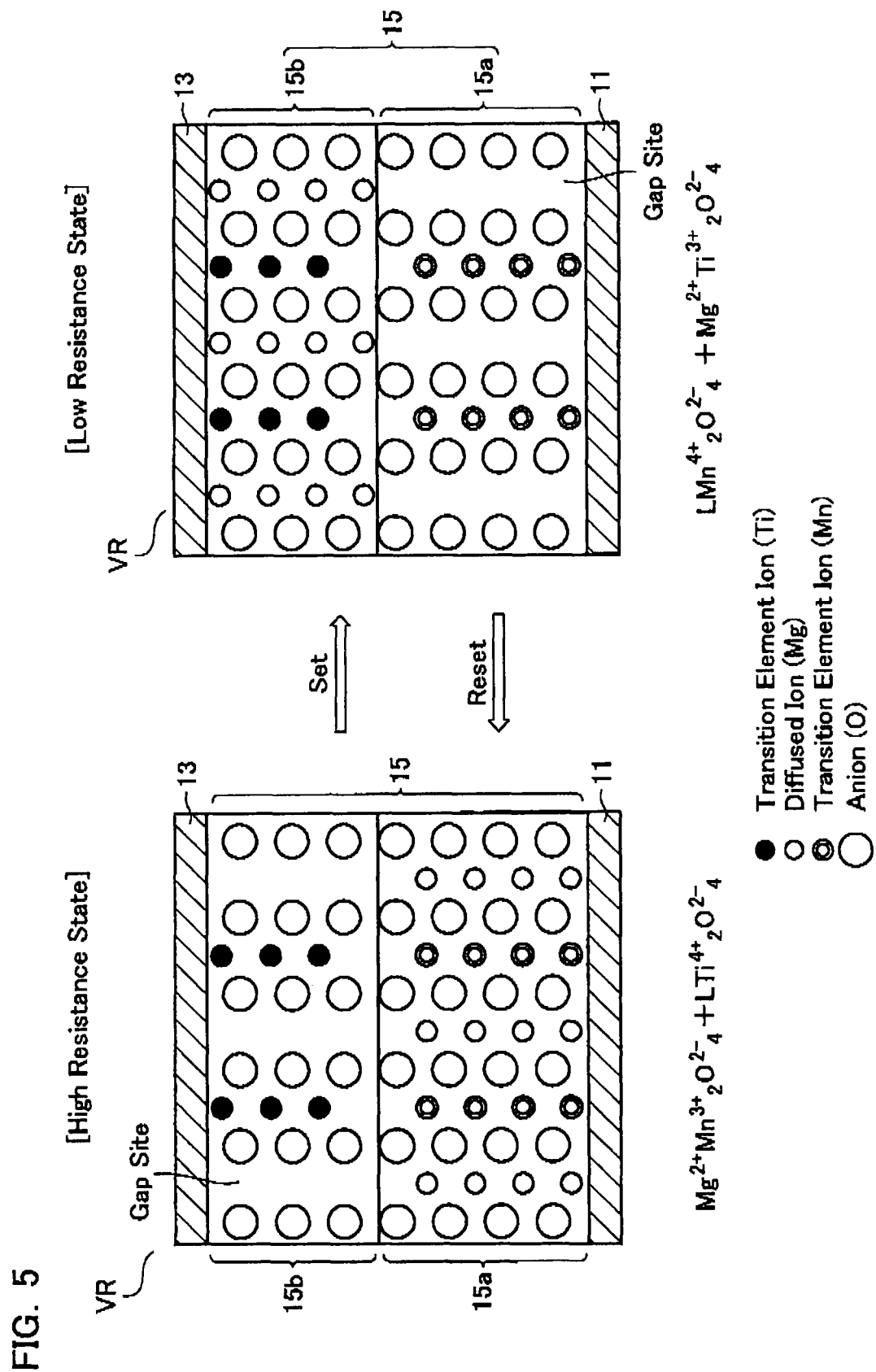
FIG. 5 is a schematic cross-sectional view showing another variable resistor example in the same embodiment.

FIGS. 4 and 5 show examples of the variable resistor. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On data reading, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has gap sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition element ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for a sufficient time for Joule heating to facilitate the oxidation reduction reaction in the recording layer 15, like in the preceding example. Application of an electric field in the opposite direction from that at the time of setting may also allow reset.

The non-ohmic element NO may include various diodes such as (a) a Schottky diode, (b) a PN-junction diode, (a) a PIN diode and may have (d) a MIM (Metal-Insulator-Metal) structure, and (e) a SIS (Silicon-Insulator-Silicon) structure as shown in FIG. 6. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistor VR may be arranged in the opposite up/down relation from FIG. 3. Alternatively, the non-ohmic element NO may have the up/down-inverted polarity.

Figure 7:
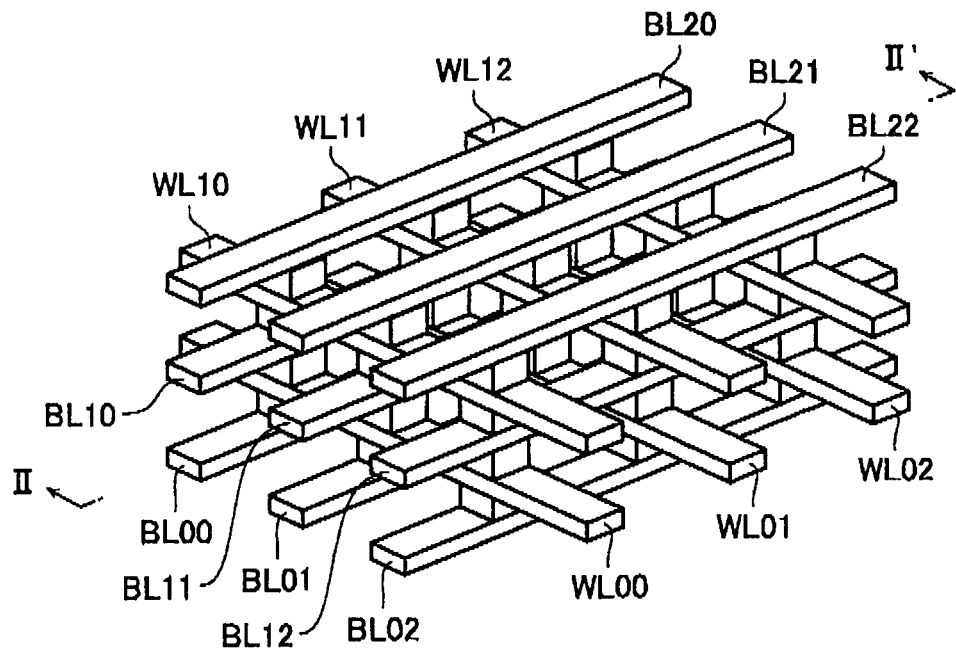
FIG. 7 is a perspective view of part of a memory cell array according to another embodiment of the present invention.
Figure 8:
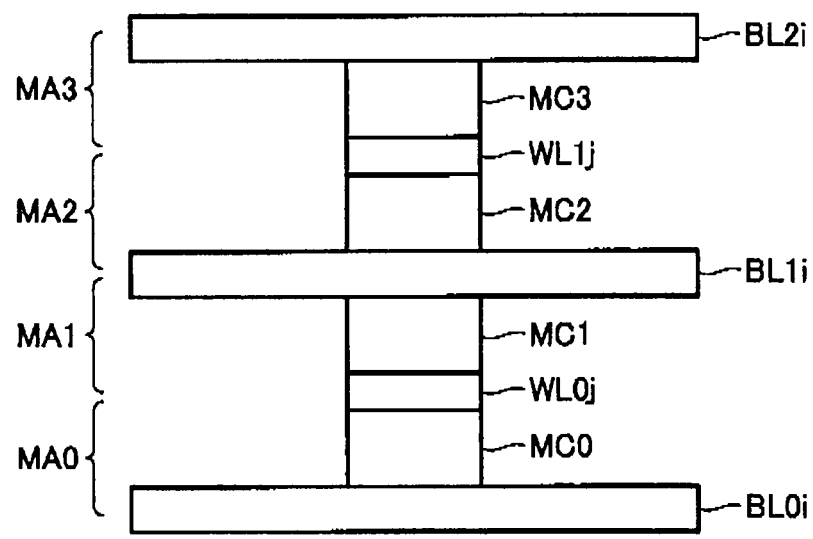
FIG. 8 is a cross-sectional view of one memory cell taken along II-II' line and seen from the direction of the arrow in FIG. 7.

Plural such memory structures described above may be stacked to form a three-dimensional structure as shown in FIG. 7. FIG. 8 is a cross-sectional view showing an II-II' section in FIG. 7. The shown example relates to a memory cell array of a 4-layer structure having cell array layers MA0-MA3. A word line WL0j is shared by an upper and a lower memory cells MC0, MC1. A bit line BL1i is shared by an upper and a lower memory cells MC1, MC2. A word line WL1j is shared by an upper and a lower memory cells MC2, MC3. In place of the line/cell/line/cell repetition, an interlayer insulator may be interposed as a line/cell/line/interlayer-insulator/line/cell/line between cell array layers.

The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 9:
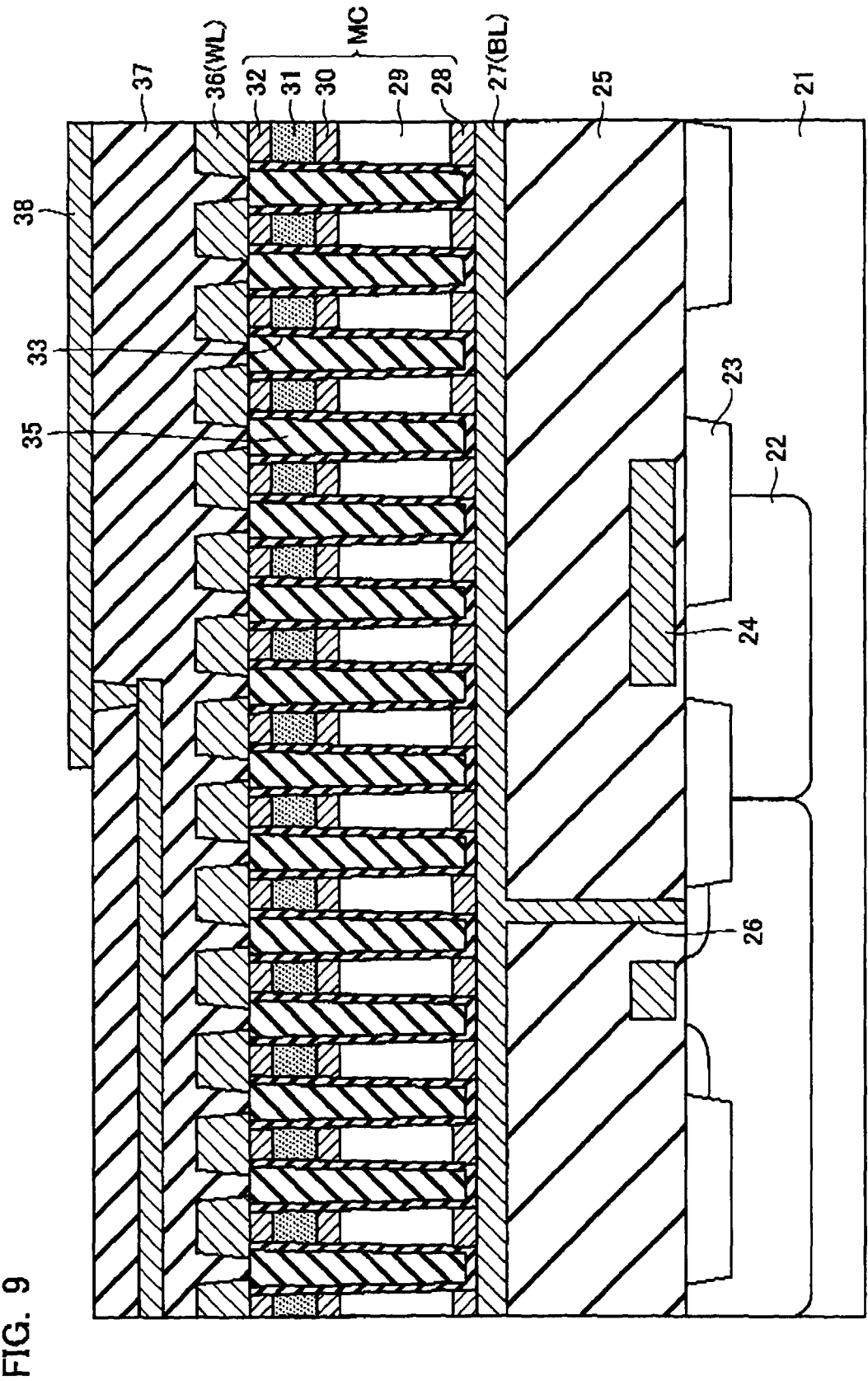
FIG. 9 is a cross-sectional view of the nonvolatile memory according to the same embodiment.

FIG. 9 is a cross-sectional view of the nonvolatile memory including the above-described memory structure in one stage. In this example, it is described that the first line is the bit line BL and the second line is the word line WL. This relation is opposite to that between the bit line BL and the word line WL as described in FIG. 2 but not related to the essence of the present embodiment. There is provided a silicon substrate 21 with a well 22 formed therein, on which an impurity-diffused layer 23 and a gate electrode 24 of a transistor contained in a peripheral circuit are formed, on which a first interlayer insulator 25 is deposited. The first interlayer insulator 25 includes a via-hole 26 appropriately formed therethrough to the surface of the silicon substrate 21. On the first interlayer insulator 25, a first metal 27 is formed of a low-resistance metal such as W to form the first line or bit line BL in the memory cell array. In an upper layer above the first metal 27, a barrier metal 28 is formed. In a lower layer below the first metal 27, a barrier metal may be formed. These barrier metals may be formed of both or one of Ti and TiN. Above the barrier metal 28, a non-ohmic element 29 such as a diode is formed. On the non-ohmic element 29, a first electrode 30, a variable resistor 31 and a second electrode 32 are formed in this order, thereby configuring a memory cell MC including the barrier metal 28 through the second electrode 32. A barrier metal may be interposed beneath the first electrode 30 and above the second electrode 32. A barrier metal, and an adhesive layer or the like may be interposed below the second electrode 32 and on the first electrode 30. The side of the memory cell MC is covered with a protection film 33 serving as an ion migration suppressing film. A second interlayer insulator 34 and a third interlayer insulator 35 are buried between the memory cell MC and an adjacent memory cell MC (the second interlayer insulator 34 is not shown in FIG. 9). On the memory cells MC in the memory cell array, a second metal 36 is formed to configure a second line or word line WL extending in the direction perpendicular to the bit line BL. A fourth interlayer insulator 37 and a metal wiring layer 38 are formed thereon to complete the variable resistance memory or nonvolatile memory. A multi-layered structure may be realized by stacking the barrier metal 28 through the second electrode 32 and forming the protection film 33 and the second and third interlayer insulators 34, 35 between the memory cells MC, repeatedly by the number of layers required.

Figure 10A:
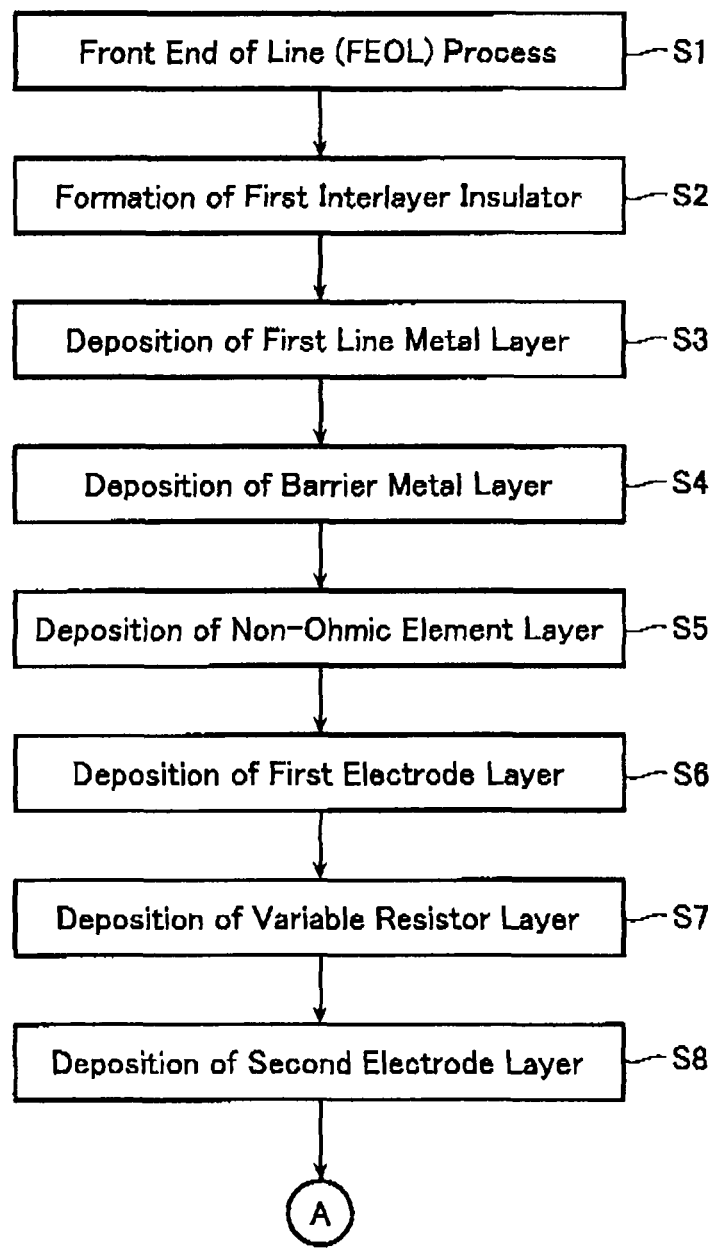
FIG. 10A is a flowchart showing a step of manufacturing the nonvolatile memory according to the same embodiment.
Figure 10B:
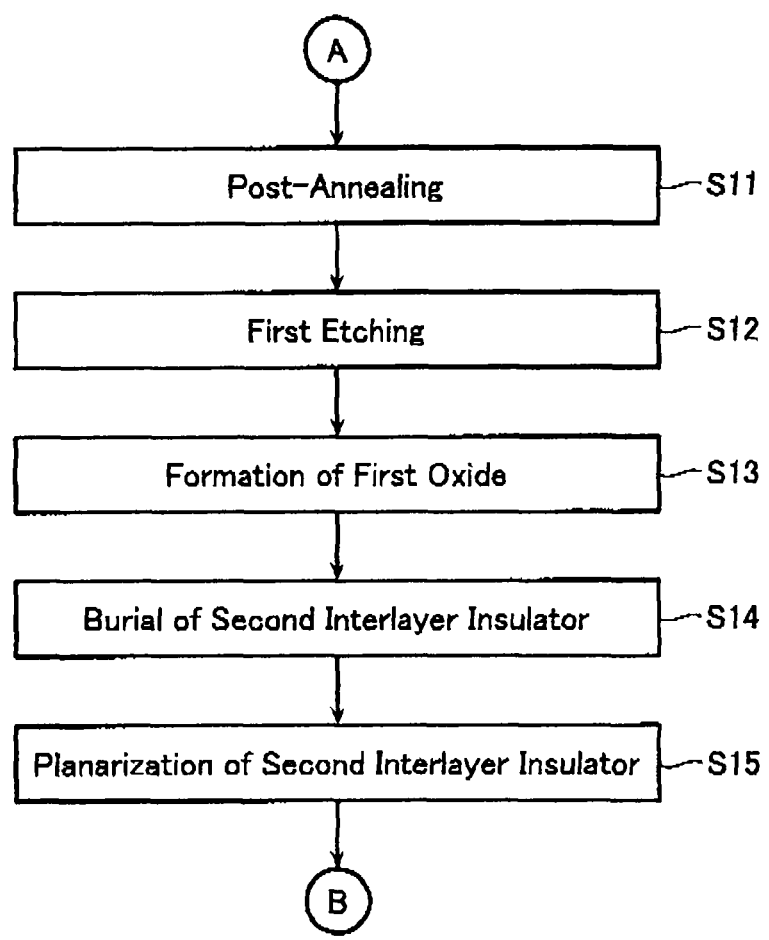
FIG. 10B is a flowchart showing a step of manufacturing the nonvolatile memory according to the same embodiment.
Figure 10C:
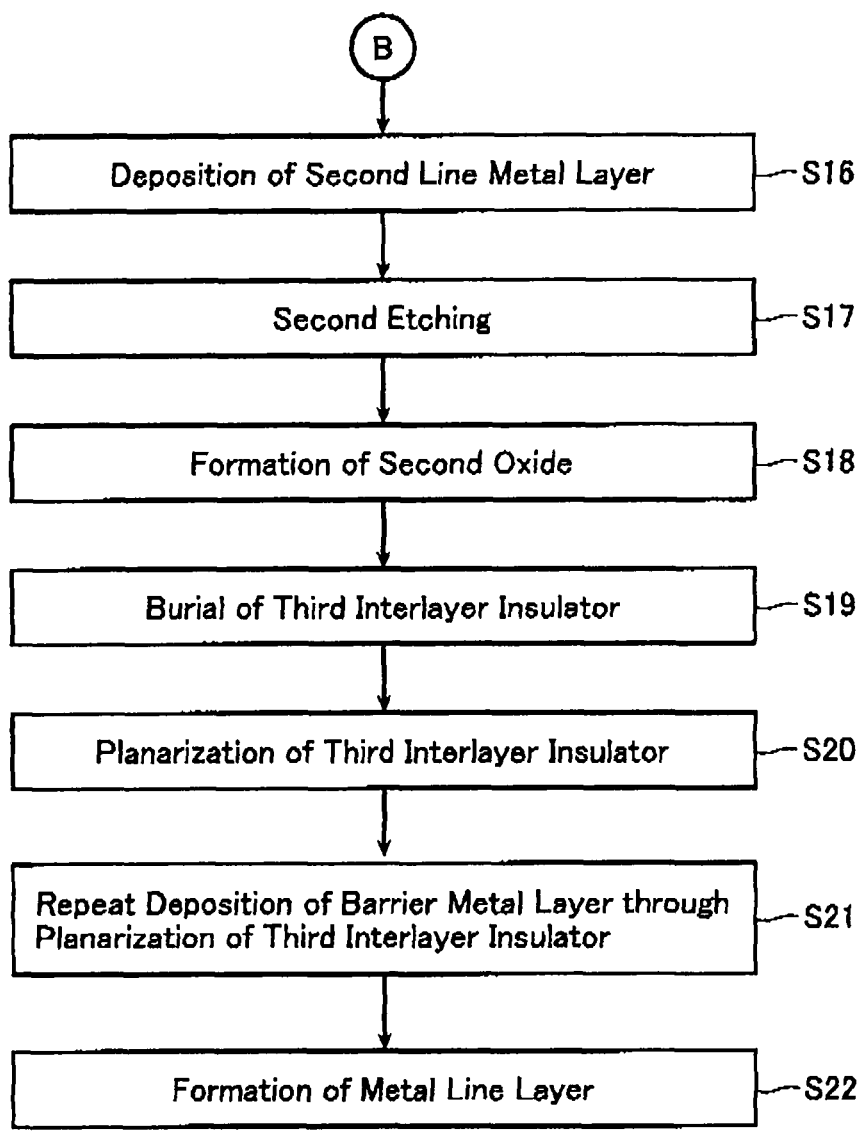
FIG. 10C is a flowchart showing a step of manufacturing the nonvolatile memory according to the same embodiment.
Figure 11:
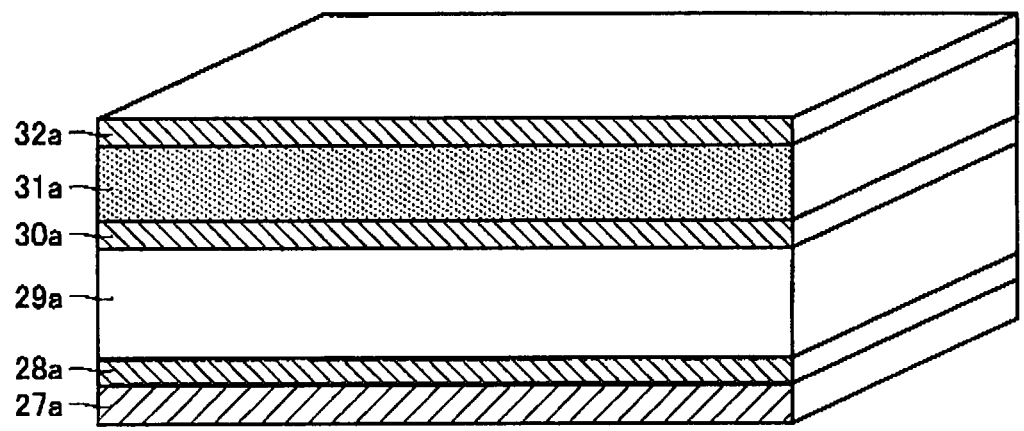
FIG. 11 is a perspective view showing a step of forming the upper layer portion in the nonvolatile memory according to the same embodiment in order of step.

FIGS. 10A-10C show process flows associated with the above-described volatile memory. First, a FEOL (Front End of Line) process for forming transistors and so forth to form necessary peripheral circuits is executed (S1), and then the first interlayer insulator 25 is deposited thereon (S2). The via-hole 26 is formed as well in this step.

Subsequently, the upper layer portion above the first metal 27 is formed.

FIGS. 11-17 are perspective views showing steps of forming the upper layer portion in order of step. Referring to FIGS. 11-17 appropriately, processes of forming the upper layer portion are described.

Once the first interlayer insulator 25 and the via-hole 26 are formed as described above, deposition thereon of a layer 27a turned into the first metal 27 in the memory cell array (S3), formation of a layer 28a turned into the barrier metal 28 (S4), deposition of a layer 29a turned into the non-ohmic element 29 (S5), deposition of a layer 30a turned into the first electrode 30, deposition of a layer 31a turned into the variable resistor 31 (S7), and deposition of a layer 32a turned into the second electrode 32 (S8) are executed sequentially. Through the above steps, the stacked structure of the upper layer portion shown in FIG. 11 can be formed.

Examples of the layer 31a turned into the variable resistor 31 include binary metal oxides such as NiO, TiO, WO and tertiary metal oxides such as ZnMnO, MgMnO. In the case of the binary metal oxide, oxidation increases Rset (the resistance at the time of set) and reduction decreases Rset. Therefore, oxidation/reduction of the metal oxide can optimize Rset. Oxidation of the side of the variable resistor material makes it possible to avoid further oxidation to achieve stabilized Rset. The oxidation of the side also makes it difficult to vary the resistance of the variable resistor and can exert the data retention improving effect.

Figure 12:
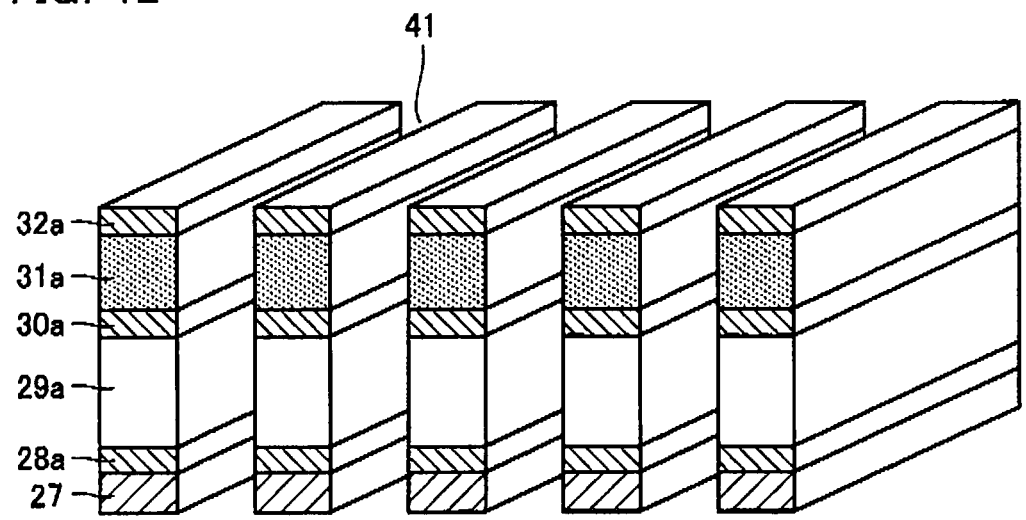
FIG. 12 is a perspective view showing a step of forming the upper layer portion in the nonvolatile memory according to the same embodiment in order of step.
Figure 13:
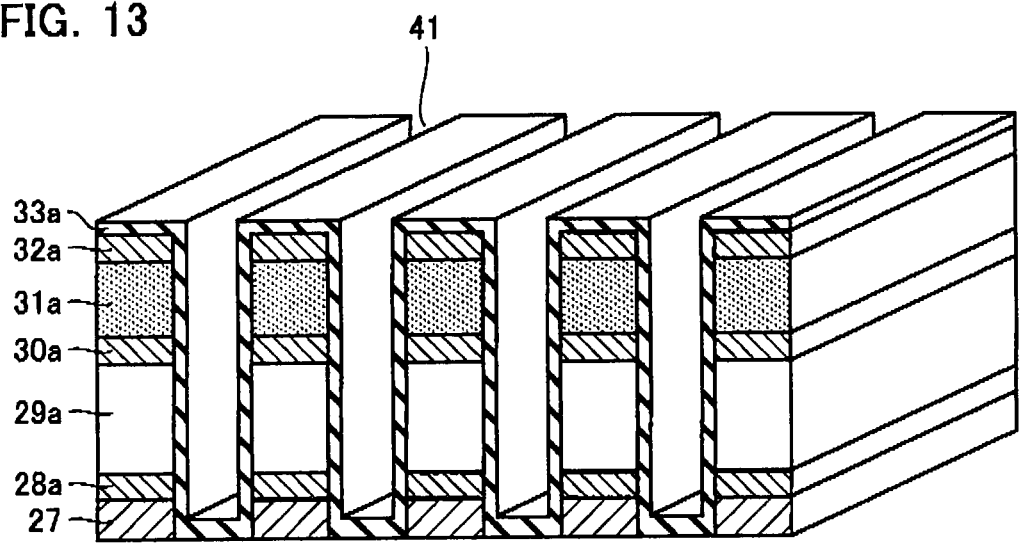
FIG. 13 is a perspective view showing a step of forming the upper layer portion in the nonvolatile memory according to the same embodiment in order of step.

As shown in FIG. 10B, in the step of depositing the layer 31a turned into the variable resistor 31 (S7), the gaseous atmosphere can be changed to vary Rset. Post-annealing in the Ar atmosphere (S11) after the step of depositing the layer 32a turned into the second electrode 32 (S8) may exert such the effect as exerted by reduction, which can adjust Rset. It also exerts the film quality improving effect such as crystallization. At this time, the temperature and the gaseous atmosphere can be changed. Thereafter, as shown in FIG. 12, trenches 41 are formed along the bit line BL to separate the stacked structure into pieces. For the purpose, a first etching is executed with L/S at the minimum pitch (S12). In this case, the side of the variable resistor 31 facing the trench 41 is exposed and accordingly a first oxide film is formed as the protection film 33 (S13) through oxidation such as ISSG (In-Situ Steam Generation), RTA (Rapid Thermal Annealing), and HTO (High-Temperature Oxide) with the temperature unchanged. Thus, a protection film 33a is formed of an oxide film as shown in FIG. 13.

Figure 14:
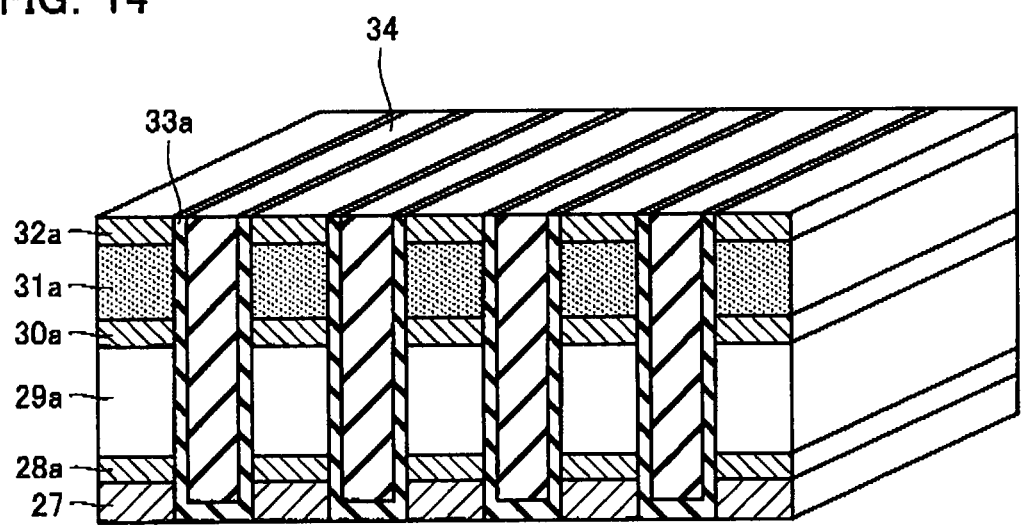
FIG. 14 is a perspective view showing a step of forming the upper layer portion in the nonvolatile memory according to the same embodiment in order of step.

Next, the second interlayer insulator 34 is buried in the trench 41 covered with the protection film 33a (S14). For the second interlayer insulator 34, a suitable material has excellent insulation, a low capacity and an excellent burial property. Subsequently, a process of CMP or the like is applied in planarization to remove extra portions from the second interlayer insulator 34 and the protection film 33a and expose the upper electrode 32 (S14). A cross-sectional view after the planarization is shown in FIG. 14. If a hard mask is used in this case, an etching or the like therefor is required.

Figure 15:
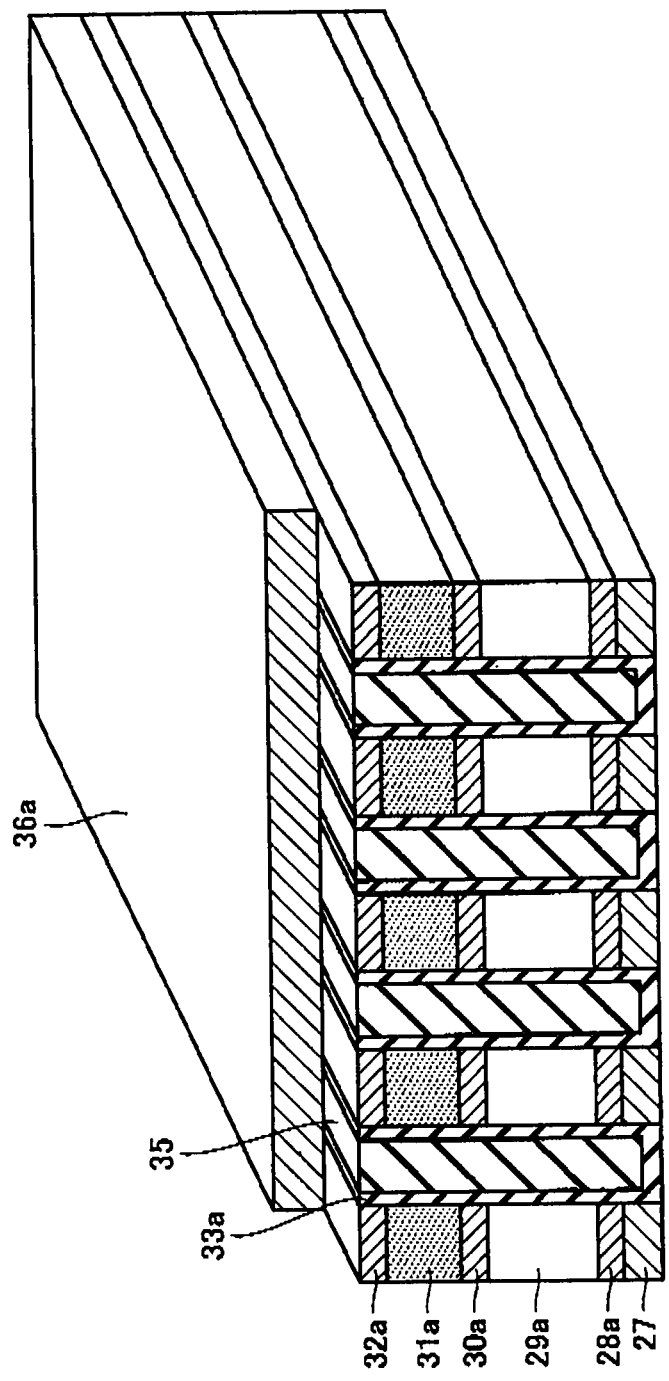
FIG. 15 is a perspective view showing a step of forming the upper layer portion in the nonvolatile memory according to the same embodiment in order of step.

A layer 36a turned into the second metal 36 is stacked over the planarized portion after CMP (S16). The state after this step is shown in FIG. 15.

Figure 16:
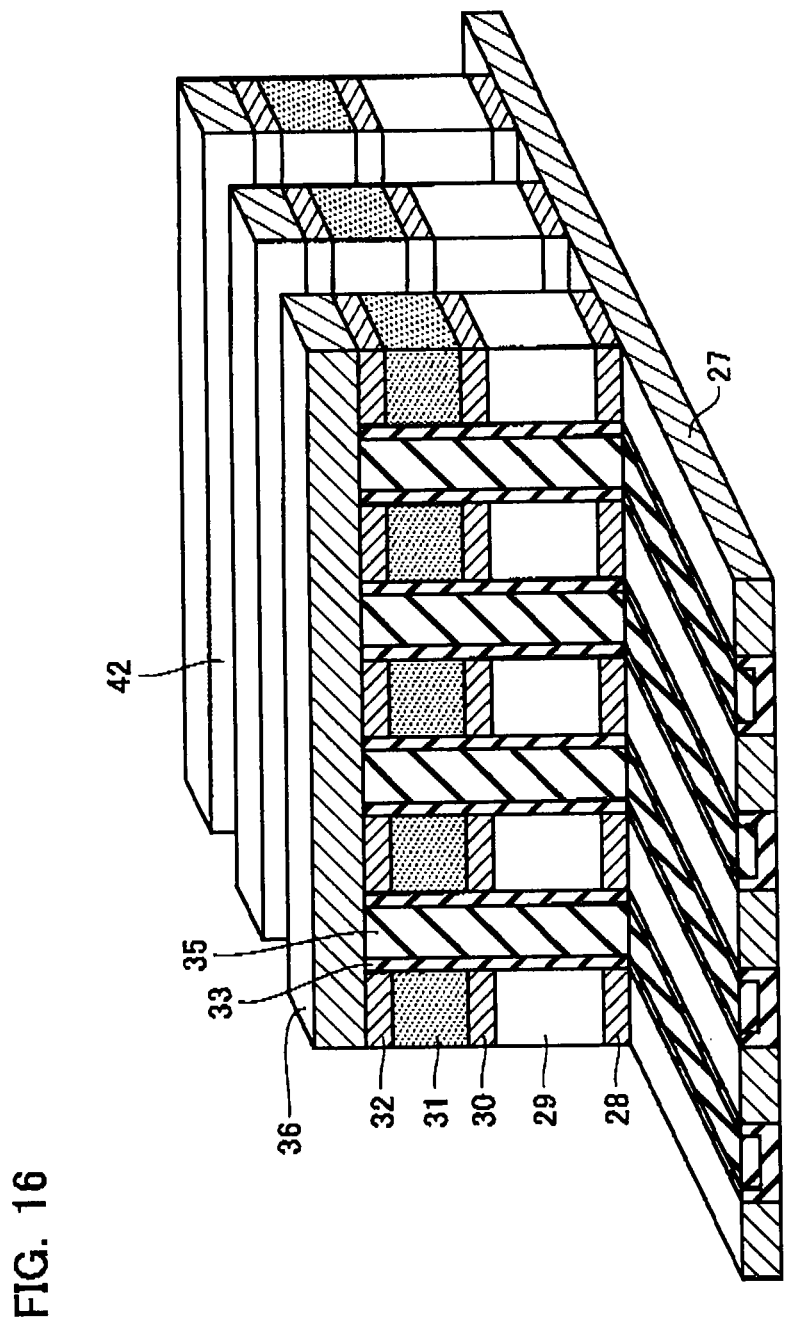
FIG. 16 is a perspective view showing a step of forming the upper layer portion in the nonvolatile memory according to the same embodiment in order of step.
Figure 17:
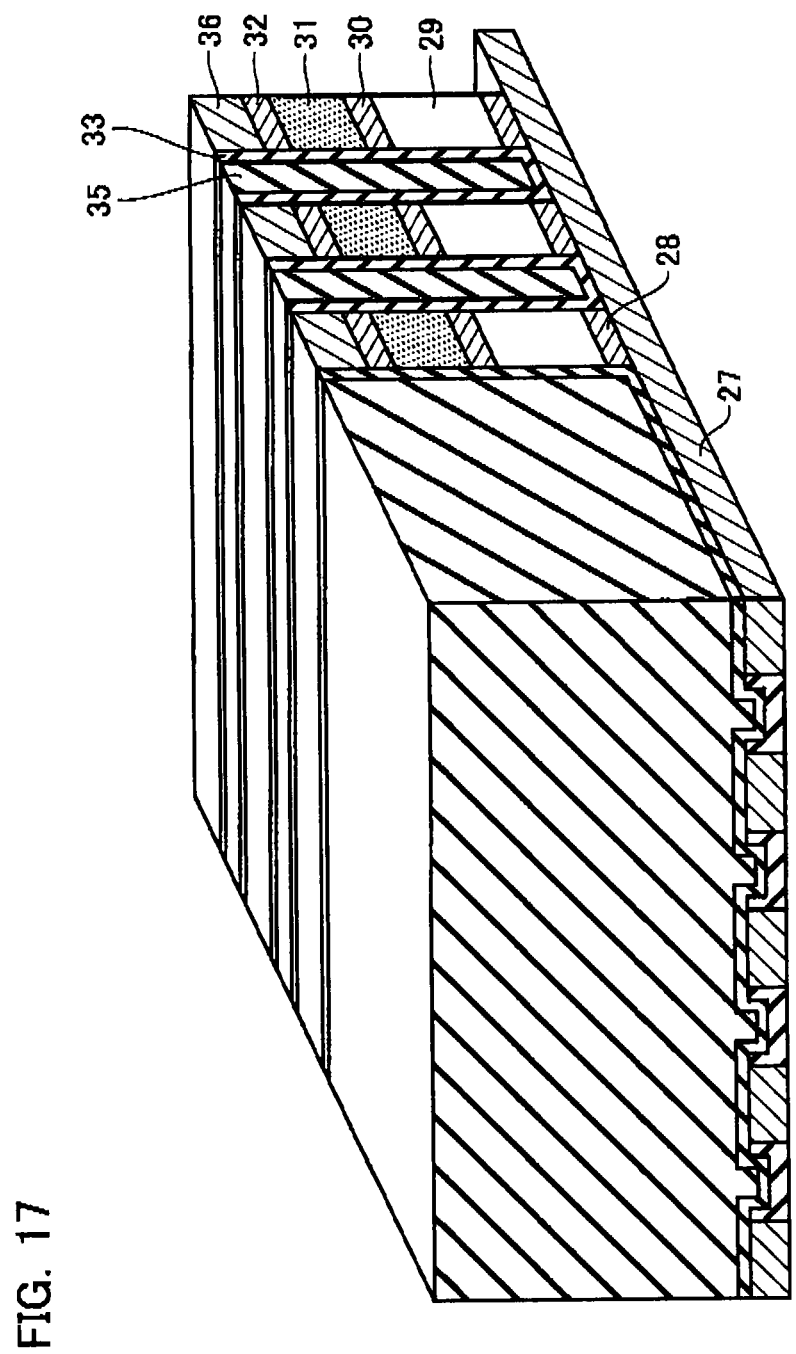
FIG. 17 is a perspective view showing a step of forming the upper layer portion in the nonvolatile memory according to the same embodiment in order of step.

Thereafter, a second etching (S17) is executed with L/S in the direction crossing the first etching (S12), thereby forming trenches 42 along the word line WL orthogonal to the bit line BL as shown in FIG. 16. At the same time, the memory cells MC separated in pillar shapes are formed at cross-points of the bit lines BL and the wordlines WL in a self-aligned manner. Thus, the side of the variable resistor 31 facing the trench 42 is exposed and accordingly a second oxide film is formed as the protection film 33 (S18). Subsequently, the third interlayer insulator is buried (S19) and then the third interlayer insulator is planarized (S20), thereby forming the memory array layer of the cross-point type as shown in FIG. 17.

Thus, through stacking flat films and patterning them twice with orthogonal L/S, such the cross-point cells can be formed in a self-aligned manner without any misalignment.

The above stacked-structure may be formed repeatedly to form a memory cell array of the multi-layered cross-point type (S21). In this case, repetition of the steps of and after depositing the barrier metal layer 28 (S4) can realized a memory cell array in which an upper layer and a lower layer share a line in the memory cell array. Alternatively, repetition of the steps of and after forming the first interlayer insulator 25 (S2) can realized a memory cell array in which an upper layer and a lower layer share no line in the memory cell array.

Thereafter, the metal wiring layer 38 is formed (S22) to complete the nonvolatile semiconductor memory device of the present embodiment.

In the present embodiment, the protection film 33 serving as the ion migration suppressing film is an oxide. Specific examples of the oxide may include oxides of chromium (Cr), tungsten (W), vanadium (V), niobium (Nb), tantalum (Ta), titanium (Ti), zirconium (Zr), hafnium (Hf), scandium (Sc), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), tin (Sn), lead (Pb), antimony (Sb), bismuth (Bi) or rare earth elements including lanthanum (La) through lutetium (Lu). Aluminum oxide ($Al_2O_3$), copper oxide (CuO), and silicon oxide ($SiO_2$) may also be formed.

Examples of the composite material include barium titanate ($BaTiO_3$), strontium titanate ($SrTiO_3$), as well as calcium titanate ($CaTiO_3$), potassium niobate ($KNbO_3$), bismuth iron oxide ($BiFeO_3$), lithium niobate ($LiNbO_3$), sodium vanadate ($Na_3VO_4$), iron vanadate ($FeVO_3$), vanadium titanate ($TiVO_3$), vanadium chromate ($CrVO_3$), nickel vanadate ($NiVO_3$), magnesium vanadate ($MgVO_3$), calcium vanadate ($CaVO_3$), lanthanum vanadate ($LaVO_3$), molybdenum vanadate ($VMoO_5$), molybdenum vanadate ($V_2MoO_8$), lithium vanadate ($LiV_2O_5$), magnesium silicate ($Mg_2SiO_4$), magnesium silicate ($MgSiO_3$), zirconium titanate ($ZrTiO_4$), strontium titanate ($SrTiO_3$), lead magnesate ($PbMgO_3$), lead niobate ($PbNbO_3$), barium borate ($BaB_2O_4$), lanthanum chromate ($LaCrO_3$), lithium titanate ($LiTi_2O_4$), lanthanum cuprate ($LaCuO_4$), zinc titanate ($ZnTiO_3$), and calcium tungstate ($CaWO_4$). These can be used to form thin films and are accordingly usable as protection films.

Among those, aluminum oxide ($Al_2O_3$), silicon oxide ($SiO_2$), barium titanate ($BaTiO_3$), strontium titanate ($SrTiO_3$), calcium titanate ($CaTiO_3$), potassium niobate ($KNbO_3$), bismuth iron oxide ($BiFeO_3$), lithium niobate ($LiNbO_3$), sodium vanadate ($Na_3VO_4$), magnesium silicate ($MgSiO_3$), zirconium titanate ($ZrTiO_4$), strontium titanate ($SrTiO_3$), barium borate ($BaB_2O_4$), and zinc titanate ($ZnTiO_3$) are suitable for protection films because of extremely higher insulation thereof.

In addition, iron vanadate ($FeVO_3$), vanadium chromate ($CrVO_3$), lanthanum vanadate ($LaVO_3$), molybdenum vanadate ($V_2MoO_8$), lead magnesate ($PbMgO_3$), lanthanum chromate ($LaCrO_3$), and calcium tungstate ($CaWO_4$) have relatively nice insulation.

The oxidation/reduction of the binary metal oxide as above and the thin film formation of the protection film make it possible to optimize Rset, reduce the side leakage current in the metal oxide, and improve the data retention.

Second Embodiment

In the above first embodiment the variable resistor including the binary metal oxide is described. In contrast, in the present embodiment an example using a variable resistor including a tertiary or higher metal oxide is described. An excessively oxidized tertiary or higher metal oxide such as ZnMnO and MgMnO increases O and elevates Rset. An excessively reduced one may also be considered to decrease O and elevate Rset. A variation in the amount of other metal ions may change Rset because the type of bond of metal ions to oxygen ions causes a conductor or an insulator correspondingly. Thus, the tertiary or higher metal oxide requires a protection film serving as the ion migration suppressing film to achieve optimization of O ions and metal ions and the composition thereof unchanged.

In the present embodiment, after the process flow of steps S1-S6 in FIG. 10A is executed like in the first embodiment, the temperature and the gaseous atmosphere are changed at deposition of the layer turned into the variable resistor (S7). As a result, the composition including plural types of metal ions and oxygen ions can be changed, thereby changing Rset. Then, the step of depositing the layer turned into the variable resistor (S7) and the deposition of the layer turned into the second electrode (SB) are executed. Thereafter, post-annealing of FIG. 10B in Ar atmosphere or the like (S11) may exert such the effect as exerted by reduction, which can adjust Rset. It also exerts the film quality improving effect such as crystallization. At this time, the temperature and the gaseous atmosphere can be changed. Thereafter, a first etching is executed (S12) to expose the variable resistor material. Accordingly, a first oxide film is formed (S13) like in the first embodiment through oxidation such as ISSG, RTA, and HTO.

In the present embodiment, the protection film 33 serving as the ion migration suppressing film is an oxide. Specific examples of the oxide may include oxides of chromium (Cr), tungsten (W), vanadium (V), niobium (Nb), tantalum (Ta), titanium (Ti), zirconium (Zr), hafnium (Hf), scandium (SC), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), tin (Sn), lead (Pb), antimony (Sb), bismuth (Bi) or rare earth elements including lanthanum (La) through lutetium (Lu). Aluminum oxide ($Al_2O_3$), copper oxide (CuO), and silicon oxide ($SiO_2$) may also be formed.

Examples of the composite material include barium titanate ($BaTiO_3$), strontium titanate ($SrTiO_3$), as well as calcium titanate ($CaTiO_3$), potassium niobate ($KNbO_3$), bismuth iron oxide ($BiFeO_3$), lithium niobate ($LiNbO_3$), sodium vanadate ($Na_3VO_4$), iron vanadate ($FeVO_3$), vanadium titanate ($TiVO_3$), vanadium chromate ($CrVO_3$), nickel vanadate ($NiVO_3$), magnesium vanadate ($MgVO_3$), calcium vanadate ($CaVO_3$), lanthanum vanadate ($LaVO_3$), molybdenum vanadate ($VMoO_5$), molybdenum vanadate ($V_2MoO_8$), lithium vanadate ($LiV_2O_5$), magnesium silicate ($Mg_2SiO_4$), magnesium silicate ($MgSiO_3$), zirconium titanate ($ZrTiO_4$), strontium titanate ($SrTiO_3$), lead magnesate ($PbMgO_3$), lead niobate ($PbNbO_3$), barium borate ($BaB_2O_4$), lanthanum chromate ($LaCrO_3$), lithium titanate ($LiTi_2O_4$), lanthanum cuprate ($LaCuO_4$), zinc titanate ($ZnTiO_3$), and calcium tungstate ($CaWO_4$). These can be used to form thin films and are accordingly usable as protection films.

Among those, aluminum oxide ($Al_2O_3$), silicon oxide ($SiO_2$), barium titanate ($BaTiO_3$), strontium titanate ($SrTiO_3$), calcium titanate ($CaTiO_3$), potassium niobate ($KNbO_3$), bismuth iron oxide ($BiFeO_3$), lithium niobate ($LiNbO_3$), sodium vanadate ($Na_3VO_4$), magnesium silicate ($MgSiO_3$), zirconium titanate ($ZrTiO_4$), strontium titanate ($SrTiO_3$), barium borate ($BaB_2O_4$), and zinc titanate ($ZnTiO_3$) are suitable for protection films because of extremely higher insulation thereof.

In addition, iron vanadate ($FeVO_3$), vanadium chromate ($CrVO_3$), lanthanum vanadate ($LaVO_3$), molybdenum vanadate ($V_2MoO_8$), lead magnesate ($PbMgO_3$), lanthanum chromate ($LaCrO_3$), and calcium tungstate ($CaWO_4$) have relatively nice insulation.

The oxidation/reduction of the tertiary or higher metal oxide as above and the thin film formation of the protection film make it possible to optimize Rset, reduce the side leakage current in the metal oxide, and improve the data retention.

Third Embodiment

The above-described first embodiment uses an oxide as the protection film 33 serving as the ion migration suppressing film. In contrast, a third embodiment uses a nitride as the protection film 33 for a binary metal oxide. Nitriding the side of the variable resistor material makes it possible to avoid further oxidation of the metal oxide to achieve stabilized Rset. Nitriding the side also makes it difficult to vary the resistance of the variable resistor and can improve the data retention.

Figure 18A:
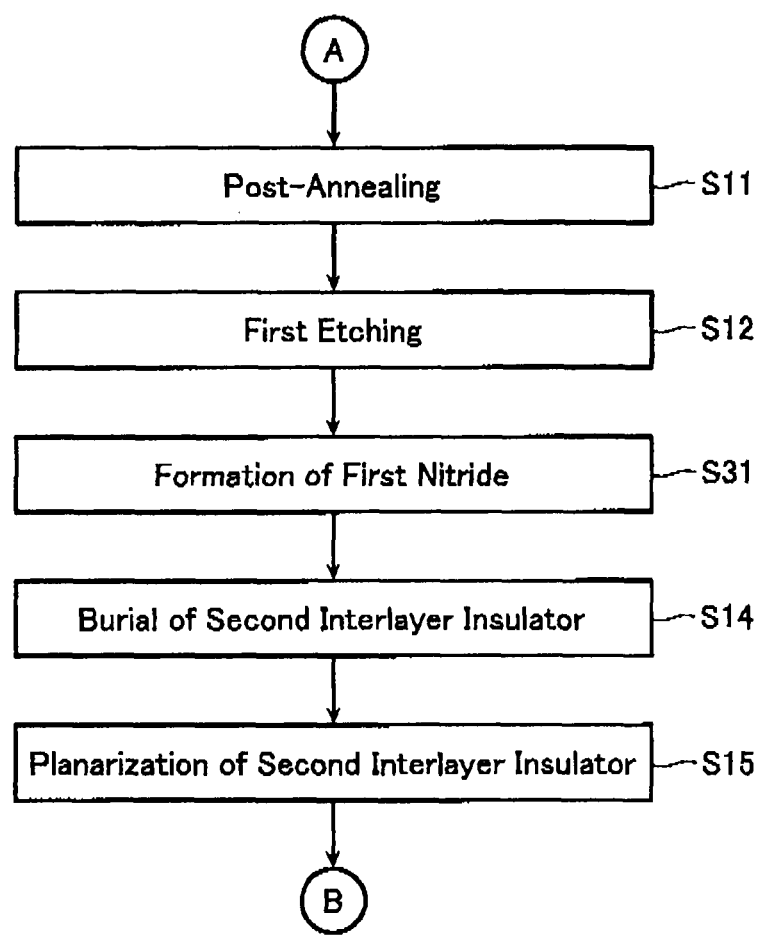
FIG. 18A is a flowchart showing a step of manufacturing a nonvolatile memory according to a third embodiment of the present invention.
Figure 18B:
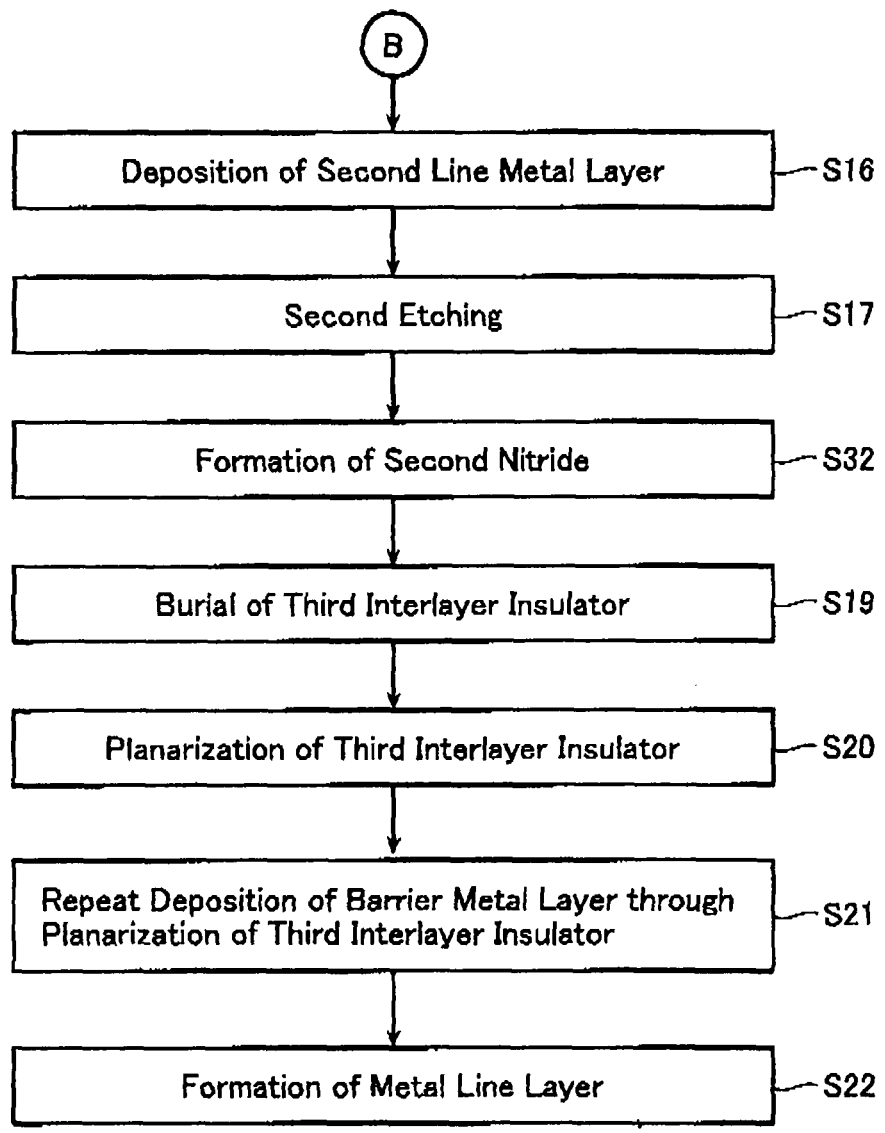
FIG. 18B is a flowchart showing a step of manufacturing the nonvolatile memory according to the third embodiment of the present invention.

A process flow in this case is shown in FIGS. 18A and 18B. Different from FIGS. 10B and 10C, a step of forming a first nitride (S31) is inserted in place of the first oxide formation (S13) after the first etching (S12). In addition, a step of forming a second nitride (S32) is inserted in place of the second oxide formation (S18) after the second etching (S17).

In the present embodiment, the protection film 33 serving as the ion migration suppressing film is a nitride. Specifically, titanium nitride (TiN), gallium nitride (GaN), indium nitride (InN), aluminum nitride (AlN), boron nitride (BN), silicon nitride ($Si_3N_4$), magnesium nitride (MgN), molybdenum nitride (MoN), calcium nitride (CaN), niobium nitride (NbN), tantalum nitride (TaN), vanadium nitride (VN), zinc nitride (ZnN), zirconium nitride (ZrN), iron nitride (FeN), copper nitride (CuN), barium nitride (BaN), lanthanum nitride (LaN), chromium nitride (CrN), yttrium nitride (YN), lithium nitride (LiN), titanium nitride (TiN), and composite nitrides thereof are applicable. In addition, oxynitrides, for example, saialons in IA, IIA, IIIB groups, such as barium saialon (BaSiAlON), calcium saialon (CaSiAlON), cerium saialon (CeSiAlON), lithium saialon (LiSiAlON), magnesium saialon (MgSiAlON), scandium saialon (ScSiAlON), yttrium saialon (YSiAlON), erbium saialon (ErSiAlON) and neodymium saialon (NdSiAlON), or multinary saialons are also applicable. Further, lanthanum nitrosilicate (LaSiON), lanthanum europium nitrosilicate ($LaEuSi_2O_2N_3$) and silicon oxynitride ($SiON_3$) are also applicable.

Among those, gallium nitride (GaN), indium nitride (InN), aluminum nitride (AlN), boron nitride (BN), silicon nitride ($Si_3N_4$), magnesium nitride (MgN), lanthanum nitride (LaN), chromium nitride (CrN), yttrium nitride (YN), barium saialon (BaSiAlON), lanthanum nitrosilicate (LaSiON), lanthanum europium nitrosilicate ($LaEuSi_2O_2N_3$) and silicon oxynitride ($SiON_3$) are suitable for protection films because of extremely higher insulation thereof.

In addition, molybdenum nitride (MoN), calcium nitride (CaN), niobium nitride (NbN), vanadium nitride (VN), zinc nitride (ZnN), zirconium nitride (ZrN), iron nitride (FeN), copper nitride (CuN), barium nitride (BaN), and lithium nitride (LiN) exhibit excellent insulation abilities.

The thin film formation of the nitride as the protection film for the binary metal oxide as above makes it possible to optimize Rset, reduce the side leakage current in the metal oxide, and improve the data retention. In addition, the nitride is a material that can cut hydrogen and accordingly it is effective to prevent reduction.

Fourth Embodiment

In the above third embodiment the variable resistor including the binary metal oxide is described. In contrast, in the present embodiment an example using a variable resistor including a tertiary or higher metal oxide is described. An excessively oxidized tertiary or higher metal oxide such as ZnMnO and MgMnO increases O and elevates Rset. An excessively reduced one may also be considered to decrease O and elevate Rset. A variation in the amount of other metal ions may change Rset because the type of bond of metal ions to oxygen ions causes a conductor or an insulator correspondingly. Thus, the tertiary or higher metal oxide requires a protection film serving as the ion migration suppressing film to achieve optimization of O ions and metal ions and the composition thereof unchanged.

In the present embodiment, after the process flow of steps S1-S6 in FIG. 10A is executed like in the third embodiment, the temperature and the gaseous atmosphere are changed at deposition of the layer turned into the variable resistor (S7). As a result, the composition including plural types of metal ions and oxygen ions can be changed, thereby changing Rset. Then, the step of depositing the layer turned into the variable resistor (S7) and the deposition of the layer turned into the second electrode (S8) are executed. Thereafter, post-annealing of FIG. 18A in Ar atmosphere or the like (S11) may exert such the effect as exerted by reduction, which can adjust Rset. It also exerts the film quality improving effect such as crystallization. At this time, the temperature and the gaseous atmosphere can be changed. Thereafter, a first etching is executed (S12) to expose the variable resistor material. Accordingly, a first oxide film is formed (S13) like in the third embodiment.

In the present embodiment, the protection film 33 serving as the ion migration suppressing film is a nitride. Specifically, titanium nitride (TiN), gallium nitride (GaN), indium nitride (InN), aluminum nitride (AlN), boron nitride (BN), silicon nitride ($Si_3N_4$), magnesium nitride (MgN), molybdenum nitride (MoN), calcium nitride (CaN), niobium nitride (NbN), tantalum nitride (TaN), vanadium nitride (VN), zinc nitride (ZnN), zirconium nitride (ZrN), iron nitride (FeN), copper nitride (CuN), barium nitride (BaN), lanthanum nitride (LaN), chromium nitride (CrN), yttrium nitride (YN), lithium nitride (LiN), titanium nitride (TiN), and composite nitrides thereof are applicable. In addition, oxynitrides, for example, saialons in IA, IIA, IIIB groups, such as barium saialon (BaSiAlON), calcium saialon (CaSiAlON), cerium saialon (CeSiAlON), lithium saialon (LiSiAlON), magnesium saialon (MgSiAlON), scandium saialon (ScSiAlON), yttrium saialon (YSiAlON), erbium saialon (ErSiAlON) and neodymium saialon (NdSiAlON), or multinary saialons are also applicable. Further, lanthanum nitrosilicate (LaSiON), lanthanum europium nitrosilicate ($LaEuSi_2O_2N_3$) and silicon oxynitride ($SiON_3$) are also applicable.

Among those, gallium nitride (GaN), indium nitride (InN), aluminum nitride (AlN), boron nitride (BN), silicon nitride ($Si_3N_4$), magnesium nitride (MgN), lanthanum nitride (LaN), chromium nitride (CrN), yttrium nitride (YN), barium saialon (BaSiAlON), lanthanum nitrosilicate (LaSiON), lanthanum europium nitrosilicate ($LaEuSi_2O_2N_3$) and silicon oxynitride ($SiON_3$) are suitable for protection films because of extremely higher insulation thereof.

In addition, molybdenum nitride (MoN), calcium nitride (CaN), niobium nitride (NbN), vanadiut nitride (VN), zinc nitride (ZnN), zirconium nitride (ZrN), iron nitride (FeN), copper nitride (CuN), barium nitride (BaN), and lithium nitride (LiN) exhibit excellent insulation abilities.

The thin film formation of the nitride for the tertiary or higher metal oxide as above makes it possible to optimize Rset, reduce the side leakage current in the metal oxide, and improve the data retention. In addition, the nitride is a material that can cut hydrogen and accordingly it is effective to prevent reduction.

Fifth Embodiment

Figure 19:
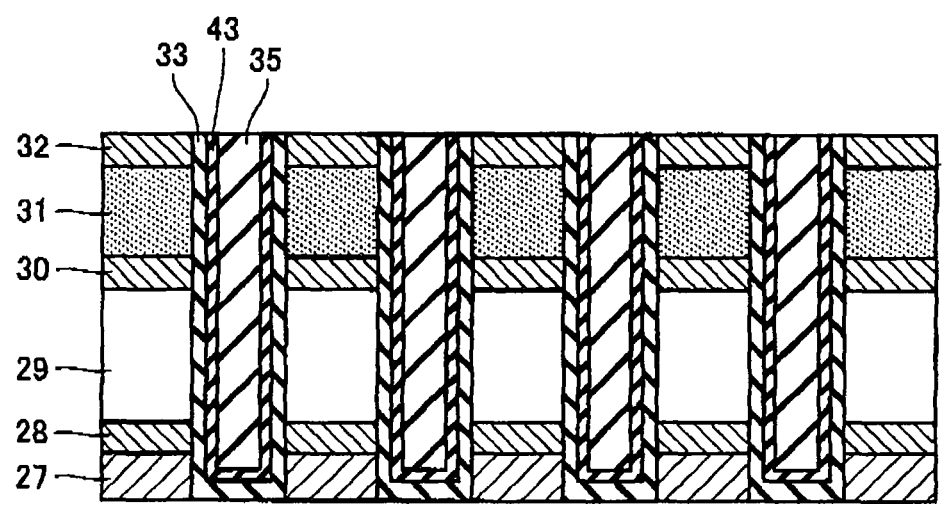
FIG. 19 is a cross-sectional view of a nonvolatile memory according to a fifth embodiment of the present invention.

The protection film serving as the ion migration suppressing film is formed of a single thin film of oxide or nitride in the above-described embodiments though the protection film may also be formed of plural thin films in a multi-layered structure. FIG. 19 shows an example of protection films 33, 43 formed in a two-layered structure. Formation of plural thin films such as ON, NO, ONO, or ONONO in this way can form a much better protection film. Thus, band engineering in thin films can prevent electrons from entering from external and further stabilize the metal oxide. The formation of thin films as the protection film for the binary metal oxide or the tertiary or higher metal oxide in this way makes it possible to optimize Rset, reduce the side leakage current in the metal oxide, and improve the data retention.

Sixth Embodiment

Figure 20A:
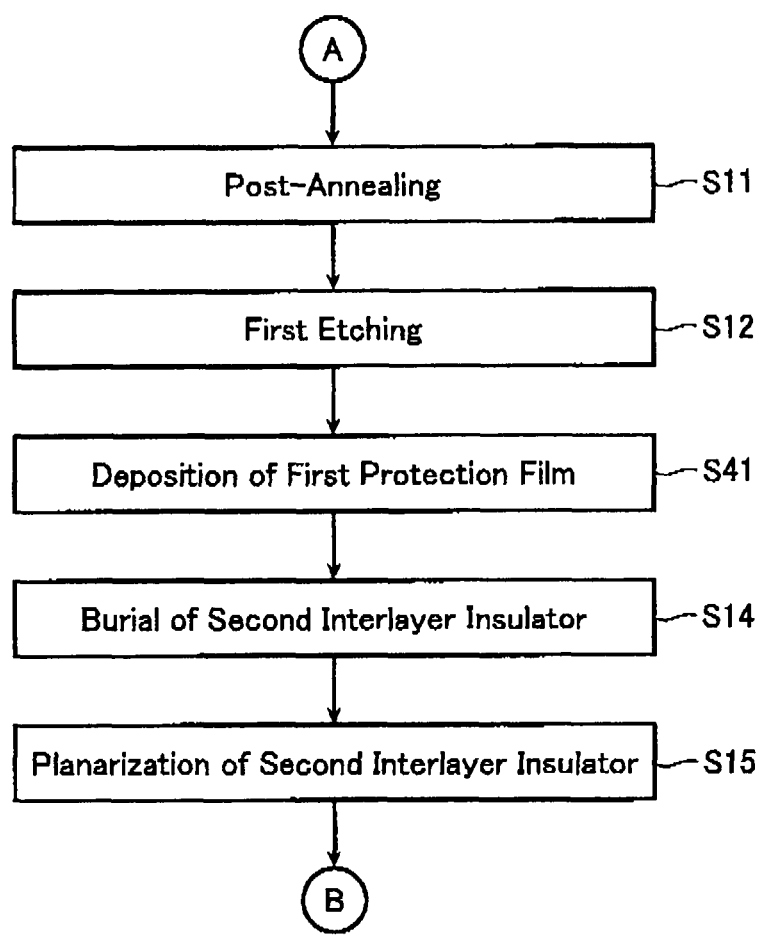
FIG. 20A is a flowchart showing a step of manufacturing a nonvolatile memory according to the third embodiment of the present invention.
Figure 20B:
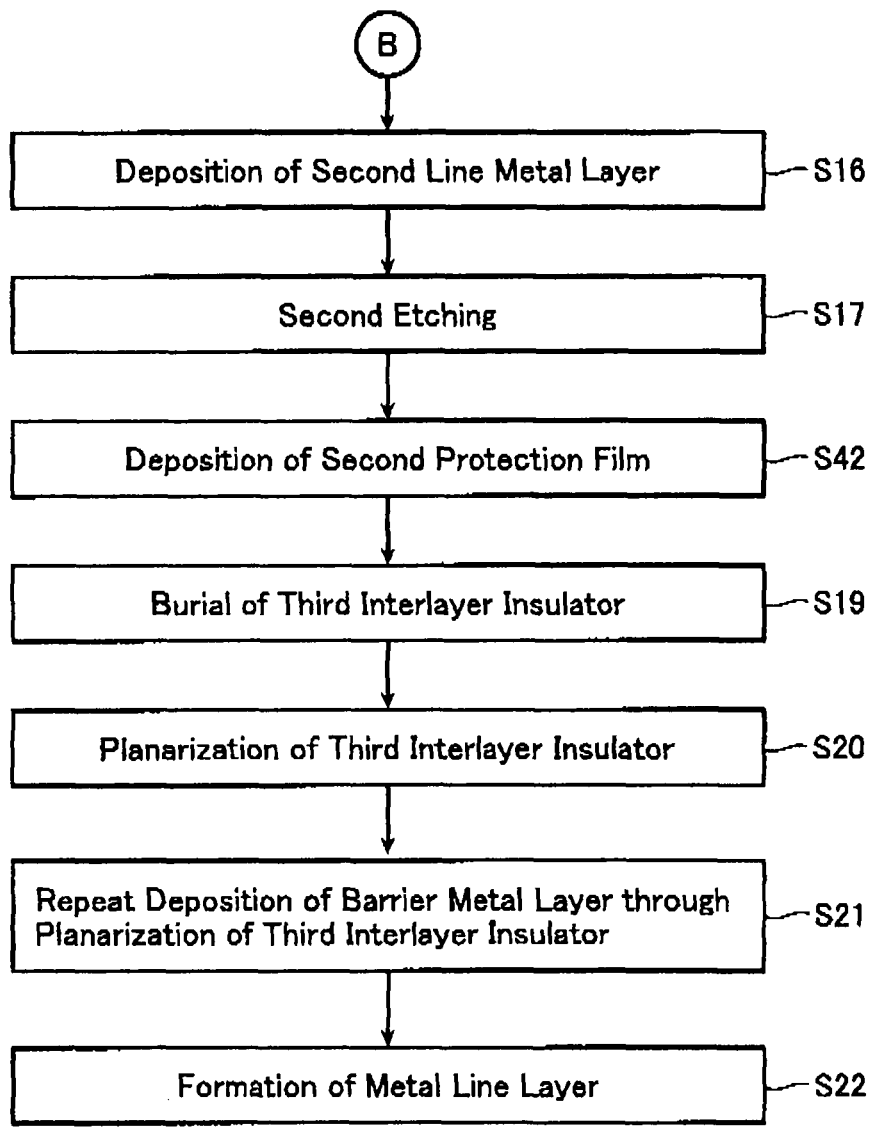
FIG. 20B is a flowchart showing a step of manufacturing the nonvolatile memory according to the third embodiment of the present invention.

The protection film 33 serving as the ion migration suppressing film is formed through oxidation or nitriding in the first through fifth embodiments though the protection film may be formed through a deposition process for either the binary metal oxide or the tertiary or higher metal oxide. A process flow in this case is shown in FIGS. 20A and 20B. Similar to other embodiments, after post-annealing the variable resistor (S11), the first etching (S12) is executed to expose the variable resistor material and a first protection film is deposited (S41) with the temperature unchanged. Thus, the layer 33a turned into the protection film can be deposited as shown in FIG. 13. In addition, after the second etching (S17), as shown in FIG. 20B, a second protection film is deposited (S42) through the same process as above.

In this case, oxides ($SiO_2$), nitrides, SiN, SiON, $Al_2O_3$, low-permittivity insulators SiOF (fluorine-added silicon oxide), SiOC (carbon-added silicon oxide), organic polymeric materials may also be used. Further, oxides of chromium (Cr), tungsten (W), vanadium (V), niobium (Nb), tantalum (Ta), titanium (Ti), zirconium (Zr), hafnium (Hf), scandium (Sc), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), tin (Sn), lead (Pb), antimony (Sb), bismuth (Bi) or rare earth elements including lanthanum (La) through lutetium (Lu) may also be deposited. In addition, aluminum oxide ($Al_2O_3$), copper oxide (CuO), and silicon oxide ($SiO_2$) may also be deposited.

As the composite material, barium titanate ($BaTiO_3$), strontium titanate ($SrTiO_3$), as well as calcium titanate ($CaTiO_3$), potassium niobate ($KNbO_3$), bismuth iron oxide (BiFeO$_3$), lithium niobate (LiNbO$_3$), sodium vanadate (Na$_3$VO$_4$), iron vanadate (FeVO$_3$), vanadium titanate (TiVO$_3$), vanadium chromate (CrVO$_3$), nickel vanadate (NiVO$_3$), magnesium vanadate (MgVO$_3$), calcium vanadate (CaVO$_3$), lanthanum vanadate (LaVO$_3$), molybdenum vanadate (VMoO$_5$), molybdenum vanadate (V$_2$MoO$_8$), lithium vanadate (LiV$_2$O$_5$), magnesium silicate (Mg$_2$SiO$_4$), magnesium silicate (MgSiO$_3$), zirconium titanate (ZrTiO$_4$), strontium titanate (SrTiO$_3$), lead magnesate (PbMgO$_3$), lead niobate (PbNbO$_3$), barium borate (BaB$_2$O$_4$), lanthanum chromate (LaCrO$_3$), lithium titanate (LiTi$_2$O$_4$), lanthanum cuprate (LaCuO$_4$), zinc titanate (ZnTiO$_3$), and calcium tungstate (CaWO$_4$) may be deposited.

As the nitride to be deposited, titanium nitride (TiN), gallium nitride (GaN), indium nitride (InN), aluminum nitride (AlN), boron nitride (BN), silicon nitride (SiN), magnesium nitride (MgN), molybdenum nitride (MoN), calcium nitride (CaN), niobium nitride (NbN), tantalum nitride (TaN), vanadium nitride (VN), zinc nitride (ZnN), zirconium nitride (ZrN), iron nitride (FeN), copper nitride (CuN), barium nitride (BaN), lanthanum nitride (LaN), chromium nitride (CrN), yttrium nitride (YN), lithium nitride (LiN), titanium nitride (TiN), and composite nitrides thereof are applicable. In addition, oxynitrides, for example, saialons in IA, IIA, IIIB groups, such as barium saialon (BaSiAlON), calcium saialon (CaSiAlON), cerium saialon (CeSiAlON), lithium saialon (LiSiAlON), magnesium saialon (MgSiAlON), scandium saialon (ScSiAlON), yttrium saialon (YSiAlON), erbium saialon (ErSiAlON) and neodymium saialon (NdSiAlON), or multinary saialons are also applicable. Further, lanthanum nitrosilicate (LaSiON), lanthanum europium nitrosilicate (LaEuSi$_2$O$_2$N$_3$) and silicon oxynitride (SiON$_3$) are also applicable.

An available method of forming thin uniform oxide or nitride films as the first and second protection films may include ALD (Atomic Layer Deposition). The deposition of the protection films for the binary metal oxide and the tertiary or higher metal oxide as above makes it possible to optimize Rset, reduce the side leakage current in the metal oxide, and improve the data retention. In addition, the use of the nitride as the protection film is effective to prevent reduction because the nitride is a material that can cut hydrogen.

Seventh Embodiment

In the above embodiments the oxide or nitride is formed or deposited as the protection film. In contrast, in the present embodiment a material having a covalent bond is used as the protection film. This material can be used to form the protection film for either the binary metal oxide or the tertiary or higher metal oxide. Namely, the protection film plays a role in preventing oxygen ions and other metal ions from being accepted/released. In a word, a film may be formed preferably to prevent ions from migrating easily. With the use of the material having a covalent bond as the protection film, the covalent bond prevents the protection film itself from deteriorating, eliminates the migration path of ions, and prevents the metal film from deteriorating. For example, SiO$_2$, diamond, carbon, and DLC (Diamond like Carbon) may be used as such the protection film.

The deposition of the protection film having a covalent bond for either the binary metal oxide or the tertiary or higher metal oxide as above makes it possible to optimize Rset, reduce the side leakage current in the metal oxide, and improve the data retention.

Eighth Embodiment

In the above embodiments the oxide or nitride is formed or deposited as the protection film, or the material having a covalent bond is used. In contrast, in the present embodiment a material having a higher valence of ion is used as the protection film. This material can be used to form the protection film for either the binary metal oxide or the tertiary or higher metal oxide. Namely, the protection film plays a role in preventing oxygen ions and other metal ions from being accepted/released. In a word, a film may be formed preferably to prevent ions from migrating easily. With the use of the material having a higher valence of ion as the protection film, the higher valence of ion prevents the protection film itself from allowing ions to migrate easily, eliminates the migration path of ions, and prevents the metal film from allowing ions to migrate and deteriorating. For example, Al$_2$O$_3$, and AlN may be used as such the protection film.

The deposition of the protection film having a higher valence of ion for either the binary metal oxide or the tertiary or higher metal oxide as above makes it possible to optimize Rset, reduce the side leakage current in the metal oxide, and improve the data retention.

Ninth Embodiment

In the above embodiments, after the thin film turned into the protection film is formed on the side of the variable resistor formed through the first and second etchings, the second and third interlayer insulators 34, 35 are buried in the trenches 41, 42. In contrast, the second and third interlayer insulators 34, 35 themselves may be used to serve as the protection film for the metal oxide.

In the present embodiment, the material, the film formation method, the film formation temperature, the atmosphere and so forth may be changed appropriately for film formation.

As the protection film, oxides (SiO$_2$), nitrides, SiN, SiON, Al$_2$O$_3$ can be used, and low-permittivity insulators such as SiOF (fluorine-added silicon oxide) and SiOC (carbon-added silicon oxide), and organic polymeric materials may also be used. Further, oxides of chromium (Cr), tungsten (W), vanadium (V), niobium (Nb), tantalum (Ta), titanium (Ti), zirconium (Zr), hafnium (Hf), scandium (Sc), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), tin (Sn), lead (Pb), antimony (Sb), bismuth (Bi) or rare earth elements including lanthanum (La) through lutetium (Lu) may also be exemplified. In addition, aluminum oxide (Al$_2$O$_3$), copper oxide (CuO), and silicon oxide (SiO$_2$) may also be formed.

As the composite material, barium titanate (BaTiO$_3$), strontium titanate (SrTiO$_3$), as well as calcium titanate (CaTiO$_3$), potassium niobate (KNbO$_3$), bismuth iron oxide (BiFeO$_3$), lithium niobate (LiNbO$_3$), sodium vanadate (Na$_3$VO$_4$), iron vanadate (FeVO$_3$), vanadium titanate (TiVO$_3$), vanadium chromate (CrVO$_3$), nickel vanadate (NiVO$_3$), magnesium vanadate (MgVO$_3$), calcium vanadate (CaVO$_3$), lanthanum vanadate (LaVO$_3$), molybdenum vanadate (VMoO$_5$), molybdenum vanadate (V$_2$MoO$_8$), lithium vanadate (LiV$_2$O$_5$), magnesium silicate (MgZSiO$_4$), magnesium silicate (MgSiO$_3$), zirconium titanate (ZrTiO$_4$), strontium titanate (SrTiO$_3$), lead magnesate (PbMgO$_3$), lead niobate (PbNbO$_3$), barium borate (BaB$_2$O$_4$), lanthanum chromate (LaCrO$_3$), lithium titanate (LiTi$_2$O$_4$), lanthanum cuprate (LaCuO$_4$), zinc titanate (ZnTiO$_3$), and calcium tungstate (CaWO$_4$) may be formed.

In this case, TiN, gallium nitride (GaN), indium nitride (InN), aluminum nitride (AlN), boron nitride (BN), silicon nitride (SiN), magnesium nitride (MgN), molybdenum nitride (MoN), calcium nitride (CaN), niobium nitride (NibN), tantalum nitride (TaN), vanadium nitride (VN), zinc nitride (ZnN), zirconium nitride (ZrN), iron nitride (FeN), copper nitride (CuN), barium nitride (BaN), lanthanum nitride (LaN), chromium nitride (CrN), yttrium nitride (YN), lithium nitride (LiN), titanium nitride (TiN), and composite nitrides thereof are applicable. In addition, oxynitrides, for example, saialons in IA, IIA, IIIB groups, such as barium saialon (BaSiAlON), calcium saialon (CaSiAlON), cerium saialon (CeSiAlON), lithium saialon (LiSiAlON), magnesium saialon (MgSiAlON), scandium saialon (ScSiAlON), yttrium saialon (YSiAlON), erbium saialon (ErSiAlON) and neodymium saialon (NdSiAlON), or multinary saialons are also applicable. Further, lanthanum nitrosilicate (LaSiON), lanthanum europium nitrosilicate ($LaEuSi_2O_2N_3$) and silicon oxynitride ($SiON_3$) may be formed as interlayer insulators.

The use of the interlayer insulator as the protection film for the binary metal oxide and the tertiary or higher metal oxide as above makes it possible to optimize Rset, reduce the side leakage current in the metal oxide, and improve the data retention. In addition, the use of the nitride as the protection film is effective to prevent reduction because the nitride is a material that can cut hydrogen.

What is claimed is:

1. A nonvolatile semiconductor memory device, comprising:
   a plurality of first lines;
   a plurality of second lines crossing said plurality of first lines;
   a plurality of memory cells each connected at an intersection of said first and second lines between both lines and including a variable resistor operative to store information in accordance with a variation in resistance;
   a protection film being a multi-layered film covering a side surface of said variable resistor; and
   an interlayer-insulator film being buried between said memory cells arranged in a direction of extension of said first lines via said protection film,
   wherein said protection film directly contacts an entire planar surface, said planar surface comprising a first side surface of said variable resistor of a first memory cell of said memory cells; a second side surface of said variable resistor of a second memory cell of said memory cells, said second memory cell being adjacent to said first memory cell in said direction; and a third side surface of said interlayer-insulator film, and said first, second, and third side surfaces being on the same side in a direction of extension of said second lines.

2. The nonvolatile semiconductor memory device according to claim 1, wherein said protection film is composed of a material having a covalent bond.

3. The nonvolatile semiconductor memory device according to claim 1, wherein said variable resistor comprises a binary metal oxide or a tertiary or higher metal oxide.

4. The nonvolatile semiconductor memory device according to claim 1, wherein said protection film comprises an oxide film.

5. The nonvolatile semiconductor memory device according to claim 1, wherein said protection film comprises a nitride film.

6. The nonvolatile semiconductor memory device according to claim 1, wherein said protection film is formed separately on a memory cell basis in a direction of extension of said second lines.

7. The nonvolatile semiconductor memory device according to claim 1, wherein:
   each of said memory cells includes a metal layer on one of said first lines, a non-linear element on said metal layer, a first electrode on said non-linear element, said variable resistor on said first electrode, a second electrode on said variable resistor; and
   said protection film is formed continuously on only side surfaces of said metal layer, said non-linear element, said first and second electrodes and said variable resistor of each of said two adjacent memory cells and on said first line.

8. The nonvolatile semiconductor memory device according to claim 1, wherein said protection film has a continuous u-shape between said adjacent memory cells.

* * * * *